United States Patent [19]

Kawamura

[11] 4,389,609
[45] Jun. 21, 1983

[54] BATTERY CHECK DEVICE

[75] Inventor: Masaharu Kawamura, Kawasaki, Japan

[73] Assignee: Canon Kabushiki Kaisha, Tokyo, Japan

[21] Appl. No.: 324,808

[22] Filed: Nov. 25, 1981

[30] Foreign Application Priority Data

Dec. 3, 1980 [JP] Japan .................... 55-171287

[51] Int. Cl.³ ............................................. H02J 7/00
[52] U.S. Cl. ....................................... 320/48; 340/636
[58] Field of Search ..................... 320/43, 48; 340/636

Primary Examiner—William M. Shoop
Assistant Examiner—Anita M. Ault
Attorney, Agent, or Firm—Toren, McGeady and Stanger

[57] ABSTRACT

The present invention relates to a battery check device particularly for displaying the state of the power source voltage with color. Until now, the battery checker for displaying the state of the power source voltage with color is provided with a plural number of color light emitting elements so as to display the state of the power source voltage with color by selectively driving the determined display element in accordance with the state of the power source voltage. However, by means of this conventional method, the state of the power source voltage can not be displayed continuously, which is inconvenient. In order to eliminate the above shortcoming, the present invention provides a battery checker for continuously displaying the change of the level of the power source voltage with color by continuously changing the color of the display means in accordance with the signal level corresponding to the state of the power source voltage.

5 Claims, 7 Drawing Figures

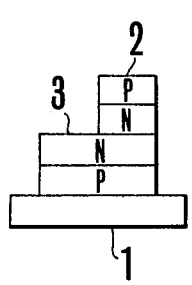
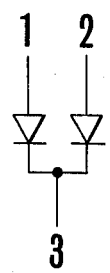
FIG.1a  FIG.1b
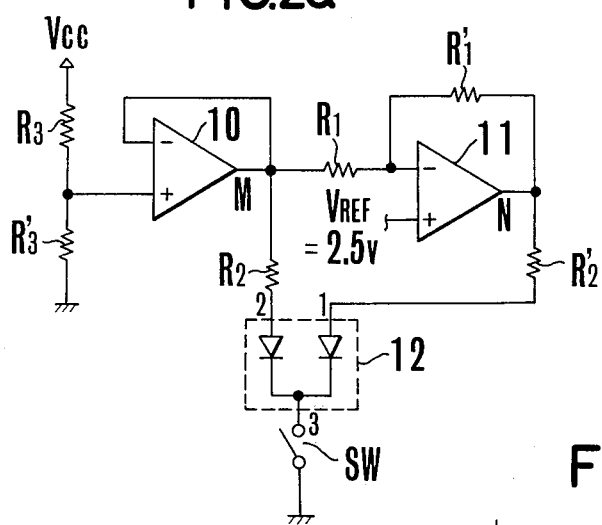
FIG.2a
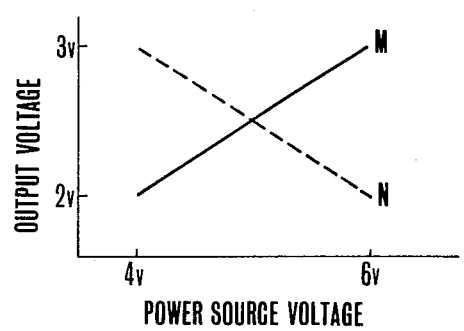
FIG.2b

BATTERY CHECK DEVICE

BACKGROUND OF THE INVENTION

1. Field of the Invention

The present invention relates to a battery check device, particularly for displaying the continuous change of the state of the power source voltage by means of the light emitting display means.

2. Description of the Prior Art

Until now, two kinds of battery check device provided with light emitting display means such as LED and so on are known. The first is designed so that a pulse generating device which oscillates with the frequency corresponding to the state of the power source voltage, whereby the light emitting display means is driven by means of the pulses coming from the pulse generating means in such a manner that the state of the power source voltage is displayed with the flickering frequency of the light emitting display means. The other one is designed so that a plural number of color light emitting display means are provided, whereby a determined color emitting display means is selected in accordance with the state of the power source voltage in a manner such that the state of the power source voltage is displayed with the displayed color.

However, in accordance with the first type, the state of the power source voltage is displayed with the flickering frequency of the light emitting display means so that it is difficult to grasp the relation between the flickering frequency and the state of the power source voltage, which is disadvantageous. On the other hand, in accordance with the second type, the state of the power source voltage is displayed in a kind of step so that it is impossible to display the continuous change of the state of the power source voltage, which is also disadvantageous.

SUMMARY OF THE INVENTION

In order to eliminate the shortcomings of the conventional device, an object of the present invention is to provide a battery check device so designed that a current corresponding to the state of the power source voltage is applied to a light emitting display element having a first and a second terminal in such a manner that color light are emitted in accordance to the value of the currents delivered to respective terminals. In this manner, the continuous change of the state of the power source voltage is displayed with the continuous change of the emitted color light, which is convenient and disadvantageous for the photographer to recognize the state of the power source voltage.

Another object of the present invention is to provide a battery check device so designed that a first and a second terminal are provided, while a light emitting display means emitting the color light in accordance to the level of the signals delivered to the respective terminals, a first signal forming means for decreasing the output signal in accordance with the decrease of the power source voltage and a second signal forming means for increasing the output signal in accordance with the decrease of the power source voltage are provided. In this manner, the output signal from the first signal forming means is delivered to the first terminal, while the output signal from the second signal forming means is delivered to the second terminal in such a manner that the color light display is carried out in accordance with the change of the state of the power source voltage.

Further, another object of the present invention is to provide a battery check device so designed that the first and the second signal forming means are constituted of the current regulating means in such a manner that the currents with the values corresponding to the state of the power source voltage are delivered to the respective terminals in order to continuously display the change of the state of the power source voltage with the change of the color light.

Further, another object of the present invention is to offer a battery check device so designed that the first and the second signal forming means are constituted of the pulse forming means forming pulses having a duty cycle corresponding to the state of the power source voltage in such a manner that the currents corresponding to the duty cycle of the pulses are delivered to the respective terminals in order to continuously display the change of the state of the power source voltage with the change of the color light.

Further, other objects of the present invention will be obvious from the explanations to be made below in accordance with the drawings of the embodiment of the present invention.

BRIEF DESCRIPTION OF THE DRAWINGS

FIGS. 1(*a*) and (*b*) show the light emitting display element to be used for the battery check device in accordance with the present invention and its equivalent circuit.

FIGS. 2(*a*) and (*b*) show the circuit of an embodiment of the battery check device in accordance with the present invention and its operation explanation diagram.

DESCRIPTION OF THE PREFERRED EMBODIMENTS

Figure 3A:
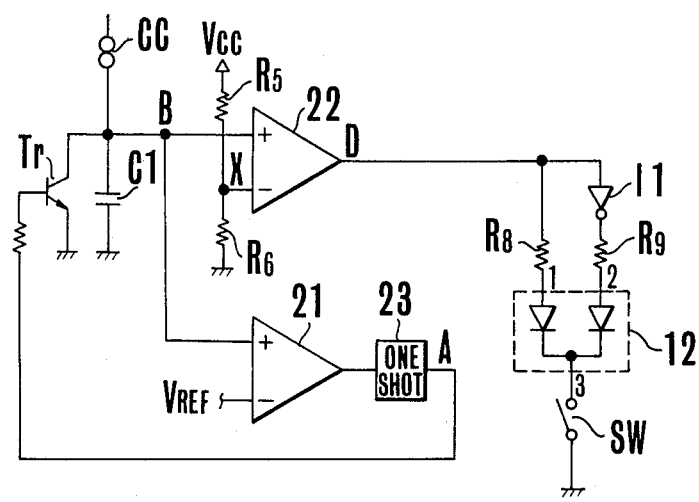
FIGS. 3(*a*) and (*b*) show the circuit of another embodiment of the battery check device in accordance with the present invention and its operation diagram.

FIGS. 1(*a*) and (*b*) show the LED as the display element to be used in the battery check device in accordance with the present invention and its equivalent circuit. The element is a single pellet type, variable color LED having the green and the red LED in a single GaP-pellet constructed in a single tip, whereby the green light is emitted when the current runs from the terminal 2 to the terminal 3, while the red light is emitted when the current runs from the terminal 1 to the terminal 3. The green light emitting level of the element is proportional to the value of the current from the terminal 2 to the terminal 3, while the red light emitting level is proportional to the value of the current from the terminal 1 to the terminal 3. Accordingly when the current runs from the terminals 1 and 2 to the terminal 3, the green and the red light are emitted in accordance with the levels proportional to the value of the current running from the corresponding terminal to the terminal 3 so as to carry out a certain determined color display consisting of both colors. In this way, by adjusting the values of the current, the color can be continuously changed from red to green.

FIG. 2(*a*) shows the circuit of an embodiment of the battery check device in accordance with the present invention. In the drawing, R3 and R3' are the resistances having the same value, to which resistances the power source voltage Vcc is applied and which resistances constitute a voltage dividing circuit.

Element 10 is the operational amplifier whose non-inverting input terminal is connected to the output of the above-mentioned voltage dividing circuit and whose inverting input terminal is connected to its output, whereby an output voltage in a positive proportion to the power source voltage is delivered from the output terminal M of the amplifier 10 as is shown in FIG. 2(b). Element 11 is the operational amplifier to whose non-inverting input terminal, a constant voltage VREF is applied and whose inverting input terminal is connected to the output of the above-mentioned amplifier 10 through the resistance R1. The output terminal of the operational amplifier 11 is connected to the above-mentioned inverting input terminal through the resistance R1' having the same value as that of the resistance R1 so as to invert the output M of the above-mentioned amplifier 10 in order to obtain the output voltage N in a negative proportion to the power source voltage as is shown in FIG. 2(b). Element 12 is the display element shown in FIG. 1, whose terminal 1 is connected to the output terminal of the above-mentioned amplifier 10 through the current adjusting resistance R2 and whose terminal 1 is connected to the output terminal of the above-mentioned amplifier 11 through the current adjusting resistance R'2 having the same value as that of the resistance R2. The terminal 3 of the element is grounded through the battery check switch SW.

Below, the operation of the embodiment shown in FIG. 2 will be explained.

Now let us suppose that the battery check switch SW is in the closed state. In this state, the output M of the operational amplifier 10 is applied to the terminal 2 of the element 12 through the resistance R2 in such a manner that a current of a value in accordance with the output M runs from the terminal 2 to the terminal 3. On the other hand, the output N of the operational amplifier 11 is applied to the terminal 1 of the element 12 through the resistance R'2 in such a manner that a current of a value in accordance with the output N runs from the terminal 1 to the terminal 3. Consequently, the display element 12 emits the green light with the level in accordance with the value of the current flowing from the terminal 2 to the terminal 3 and at the same time, the red light with the level in accordance with the value of the current running from the terminal 1 to the terminal 3 in such a manner that the element carries out the color display in accordance with the level of the current flowing into the terminals 1 and 2 so as to indicate the power source voltage. Now let us suppose that the power source voltage is 6 V. Then the output level of the amplifier 10 is 3 V, while the output level of the amplifier 11 is 2 V. Consequently, the level of the green light is remarkably higher than that of the red light so that the element displays green color, indicating that the power source has a sufficient voltage. Now let us suppose that the power source voltage be 5 V. Then, the output level M of the amplifier 10 is equal to the output level N of the amplifier 11, namely, the level of the green light is equal to that of the red light so that the element displays the yellow color, indicating that the power source voltage is decreased. Now let us suppose that the power source voltage be 4 V. Then, the output level N of the amplifier 11 is remarkably higher than that M of the amplifier 10, whereby the red color is displayed so as to indicate that the power source voltage is lower than the serviceable one.

FIGS. 3(a) and (b) show the circuit and the explanation of another embodiment of the battery check device in accordance with the present invention. In FIG. 3(a), CC is the constant current circuit for delivering a current with a constant value, C1 the condenser constituting the timer circuit together with the above-mentioned constant current circuit and 21 the comparator whose positive input terminal is connected to the output terminal of the above-mentioned condenser C1 and to whose negative input terminal a constant voltage VREF is applied from a constant voltage source (not shown). Element 23 is the one shot circuit connected to the output terminal of the comparator 21 and Tr the transistor connected in parallel to the above-mentioned condenser C1. The base of which transistor is connected to the output of the one shot circuit 23. R5 and R6 are the voltage dividing resistances to be applied with the power source voltage Vcc, element 22 the comparator whose positive input terminal is connected to the output terminal of the above-mentioned condenser C1 and whose negative input terminal is connected to the output terminal of the above-mentioned voltage dividing resistances and element 12 the LED display element, whose terminal 1 is connected to the output terminal of the comparator 22 through the resistance R8 and whose terminal 2 is connected to the output terminal of the above-mentioned comparator 22 through the inverter I1 and the resistance R9.

Below, the operation of the embodiment shown in FIG. 3(a) will be explained.

Figure 3B:
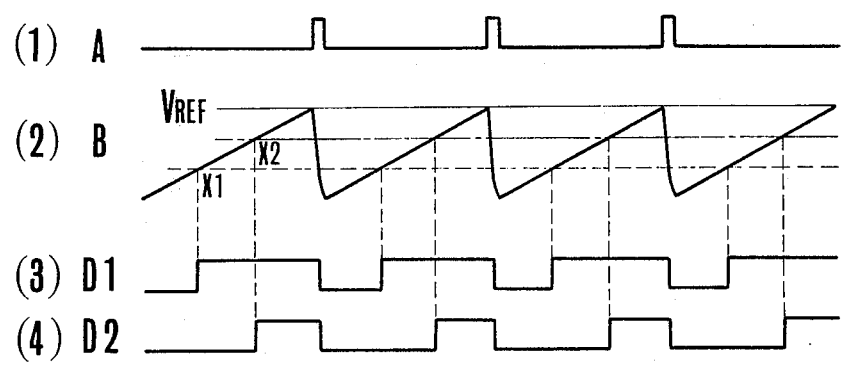

Because the condenser C1 is connected to the constant current circuit CC, the condenser C1 is charged with a constant current so that the output B of the condenser C1 goes up with a certain determined inclination. As soon as the output of the condenser C1 reaches a certain determined voltage VREF, the comparator 21 delivers a high level signal, while the one shot circuit 23 delivers a single pulse A as is shown in FIG. 3(b). Thus, the transistor Tr is brought in the switched on state so as to short circuit the condenser C1, whose output level assumes the initial state. Further, the transistor Tr is in the switched on state only during the time of a pulse width of the one shot circuit 23 so that the condenser C1 is again changed with the determined current. In this way, the condenser C1 is changed at a certain determined time interval, whereby the output B changes as is shown in FIG. 3(b). On the other side, while the condenser C1 is being charged, the output B of the condenser C1 is compared with the output X of the voltage dividing resistances in the comparator 22. Now let us suppose that the power source voltage is low, while the voltage divided output level is X1. After a comparatively short time after the start of the charge of the condenser C1, the output of the comparator 22 is inverted so as to deliver a high level signal, which signal is held until the condenser C1 is discharged as mentioned above. Thus, the output of the comparator 22 is delivered as a pulse with large duty cycle as is shown with D1 in FIG. 3(b) to the terminal 1 of the display element during the pulse time. On the other hand, the pulse is inverted in the inverter I1 and delivered to the terminal 2. Consequently the time of the pulses delivered to the terminal 1 of the display element 12 during the unit time is longer than the time of the pulses delivered to the terminal 2 so that the red color is displayed so as to indicate that the power source voltage has been lowered.

On the other hand, when the power source voltage is high, the voltage divided level is as high as X2. Thus, the time during which the output B of the condenser C1 reaches the level X2 is long and the output of the comparator 22 is a pulse with small duty cycle as is shown with D2 in FIG. 3(b). Consequently, in this case, the time of the pulse delivered to the terminal 2 of the element 12 during the unit time is shorter than the time of the pulse delivered to the terminal 1 so that the green color is displayed so as to indicate that the power source has a sufficient voltage. As mentioned above, in the case of the present embodiment, the duty cycle of the pulse to be applied to the element 12 is decided in accordance with the power source voltage and the color display is carried out in accordance with the duty cycle so as to indicate the state of the power source voltage.

Figure 4:
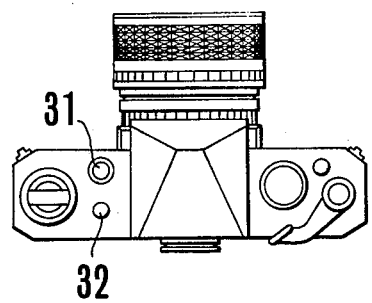
FIG. 4 shows the battery check device in accordance with the present invention applied for the camera.

FIG. 4 shows an embodiment of the battery check device in accordance with the present invention applied to a camera, whereby element 31 is the battery check operation button in operative engagement with the switch SW shown in FIGS. 2 and 3 and element 32 the display element shown in FIGS. 2 and 3. By constituting the device as mentioned above, the state of the power source voltage of the camera can be displayed with color by operating the button 31.

As explained above in detail, the battery check device in accordance with the present invention is provided with an LED display element carrying out the color light display in accordance with the value of the current flowing into the terminals 1 and 2, whereby in accordance with the power source voltage, the value of the currents to be delivered to respective terminals is controlled so as to display the state of the power source voltage with the change of the color light. This allows the photographer to recognize the state of the power source voltage remarkably easily, which is very advantageous.

What is claimed is:

1. A battery check device comprising:
   (a) display means, said means including a first and a second terminal for carrying out a display with colors in accordance with the level of the signals delivered to the respective terminals;
   (b) first signal forming means for decreasing the output signal in accordance with the decrease of the power source voltage, the output signal of said means being delivered to the first terminal of the display means; and
   (c) second signal forming means for increasing the output signal in accordance with the decrease of the power source voltage, the output signal of said means being delivered to the second terminal of the display means;
   whereby the display means carries out the display with colors corresponding to the state of the power source voltage in accordance with the output signals from the first and the second signal forming means.

2. A battery check device in accordance with claim 1, wherein the display means emit the light of the first color with the level corresponding to the signal delivered to the first terminal and the light of the second color with the level corresponding to the signal delivered to the second terminal, whereby the display is carried out with the sum of the first color level and the second color level.

3. A battery check device comprising:
   (a) display means, said means including a first and a second terminal carrying out the display with colors corresponding to the value of the current delivered to the respective terminals; and
   (b) a current control circuit for delivering the output current corresponding to the power source voltage, said circuit including first means for decreasing the output current in accordance with the decrease of the power source voltage and second means for increasing the output current in accordance with the decrease of the power source voltage;
   whereby the output current from the first means is delivered to the first terminal and the output current from the second means is delivered to the second terminal carrying out the display with the color in accordance with the state of the power source voltage.

4. A battery check device comprising:
   (a) display means, said means including a first and a second terminal carrying out the display with the color corresponding to the amount of the signals delivered to the respective terminals per unit time;
   (b) first signal forming means for decreasing the amount of the output signal in accordance with the decrease of the power source voltage, the output signal from said means being delivered to the first terminal of the display means; and
   (c) second signal forming means for increasing the amount of the output signal in accordance with the decrease of the power source voltage, the output signal from said means being delivered to the first terminal of the display means;
   whereby the display means carries out the display with the color corresponding to the state of the power source voltage in accordance with the amount of the output signals from the first and the second signal forming means.

5. A battery check device comprising:
   (a) display means, said means including a first and a second terminal for carrying out the display with the color corresponding to the duty cycle of the pulses delivered to the respective terminals;
   (b) first pulse means for decreasing the duty cycle of the pulses in accordance with the decrease of the power source voltage, the pulses from said means being delivered to the first terminal of the display means; and
   (c) second pulse means for increasing the duty cycle of the pulses in accordance with the decrease of the power source voltage, the pulses from said means being delivered to the second terminal of the display means;
   whereby the display means carries out the display with the color corresponding to the state of the power source voltage in accordance with the pulses from the first and the second pulse means.

* * * * *